(12) United States Patent
Majima

(10) Patent No.: US 12,504,691 B2
(45) Date of Patent: Dec. 23, 2025

(54) DRAWING APPARATUS, DRAWING SYSTEM, AND DRAWING METHOD

(71) Applicant: SCREEN Holdings Co., Ltd., Kyoto (JP)

(72) Inventor: Shota Majima, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 190 days.

(21) Appl. No.: 18/039,339

(22) PCT Filed: Dec. 3, 2021

(86) PCT No.: PCT/JP2021/044539
§ 371 (c)(1),
(2) Date: May 30, 2023

(87) PCT Pub. No.: WO2022/138079
PCT Pub. Date: Jun. 30, 2022

(65) Prior Publication Data
US 2023/0418162 A1 Dec. 28, 2023

(30) Foreign Application Priority Data
Dec. 21, 2020 (JP) ................................ 2020-211277

(51) Int. Cl.
*G03F 7/20* (2006.01)
(52) U.S. Cl.
CPC ...................................... *G03F 7/20* (2013.01)
(58) Field of Classification Search
CPC ........................................................ G03F 7/20
See application file for complete search history.

(56) References Cited

U.S. PATENT DOCUMENTS

| 6,567,972 B1 | 5/2003 | Tanaka et al. |
| 6,576,377 B2 | 6/2003 | Kikuchi |

(Continued)

FOREIGN PATENT DOCUMENTS

| JP | 55-080318 A | 6/1980 |
| JP | 64-061753 A | 3/1989 |

(Continued)

OTHER PUBLICATIONS

International Preliminary Report on Patentability and Written Opinion dated Jun. 29, 2023 in corresponding International Application No. PCT/JP2021/044539 with English translation.

(Continued)

*Primary Examiner* — Hung V Nguyen
(74) *Attorney, Agent, or Firm* — OSTROLENK FABER LLP

(57) ABSTRACT

Provided is a drawing apparatus capable of drawing with high accuracy on a surface having a shape whose height exceeds a focal depth without complicatedly adjusting focus of an optical system. A substrate can be placed on a stage. A drawing head includes a spatial light modulator that generates modulated light, and a projection optical system that focuses the modulated light on a focus position in a height direction over the stage. A mover relatively moves the stage and the drawing head in the horizontal direction. A controller controls the mover and the drawing head. The controller controls the spatial light modulator based on correction pattern data representing a correction pattern, and the correction pattern data is generated by correcting design pattern data representing a design pattern based on surface profile data representing a surface profile of the substrate.

15 Claims, 13 Drawing Sheets

(56) References Cited

U.S. PATENT DOCUMENTS

| | | | | |
|---|---|---|---|---|
| 8,274,642 | B2* | 9/2012 | Matsuura | G03F 7/70791 |
| | | | | 355/53 |
| 8,785,888 | B2* | 7/2014 | Honjo | G03F 7/7015 |
| | | | | 250/492.1 |
| 2004/0088675 | A1 | 5/2004 | Nakano et al. | |
| 2008/0220344 | A1* | 9/2008 | Nakaya | G03F 9/7003 |
| | | | | 430/30 |
| 2010/0103397 | A1* | 4/2010 | Nemoto | G03B 27/32 |
| | | | | 355/70 |
| 2013/0057552 | A1* | 3/2013 | Yoshiwa | H01J 37/3177 |
| | | | | 345/441 |
| 2016/0091794 | A1 | 3/2016 | Shibata et al. | |
| 2020/0209762 | A1 | 7/2020 | Buhl et al. | |

FOREIGN PATENT DOCUMENTS

| | | |
|---|---|---|
| JP | 2004-077824 A | 3/2004 |
| JP | 2006-276491 A | 10/2006 |
| JP | 2007-250810 A | 9/2007 |
| JP | 2007-335055 A | 12/2007 |
| JP | 2009-115844 A | 5/2009 |
| JP | 2015-170838 A | 9/2015 |
| JP | 2016-071135 A | 5/2016 |
| JP | 2020-046460 A | 3/2020 |
| JP | 2020-091330 A | 6/2020 |
| JP | 2020-109477 A | 7/2020 |
| TW | 482948 B | 4/2002 |
| TW | 202020571 A | 6/2020 |
| TW | 202028880 A | 8/2020 |

OTHER PUBLICATIONS

Notice of Reasons For Rejection dated Jul. 9, 2024 in corresponding Japanese Patent Application No. 2020-211277 and a computer generated English language translation obtained from the JPO.

Notice of Decision to Grant with Search Report dated Sep. 18, 2024 in corresponding Taiwanese Patent Application No. 110147621.

International Search Report mailed Feb. 15, 2022 in corresponding PCT International Application No. PCT/JP2021/044539.

Written Opinion mailed Feb. 15, 2022 in corresponding PCT International Application No. PCT/JP2021/044539.

Notice of Opinion for Examination with Search Report dated Aug. 18, 2022 in corresponding Taiwanese Patent Application No. 110147621 with English machine language translation made from Japanese translation of the original communication.

Decision of Rejection dated Jan. 16, 2023 in corresponding Taiwanese Patent Application No. 110147621 with English machine language translation made from Japanese translation of the original communication.

* cited by examiner

DRAWING APPARATUS, DRAWING SYSTEM, AND DRAWING METHOD

CROSS-REFERENCE TO RELATED APPLICATIONS

The present application is a 35 U.S.C. §§ 371 national phase conversion of International Application No. PCT/JP2021/044539, filed Dec. 3, 2021, which claims priority to Japanese Patent Application No. 2020-211277, filed Dec. 21, 2020, the contents of both of which are incorporated herein by reference. The PCT International Application was published in the Japanese language.

TECHNICAL FIELD

The present invention relates to a drawing apparatus, a drawing system, and a drawing method, and more particularly, to a drawing apparatus, a drawing system, and a drawing method which use a drawing head.

BACKGROUND ART

As a typical exposure method in photolithography, a method of projecting a pattern of a photomask onto a substrate by an optical system has been widely used. On the other hand, a method of drawing a pattern on a photosensitive surface using a drawing head, in other words, direct drawing is also used, and in this case, there is an advantage that the photomask is not required. As a technique of the direct drawing, for example, Japanese Patent Application Laid-Open No. 2015-170838 (Patent Document 1) discloses an exposure method intended to reduce an exposure defect when a film pattern such as wiring is formed on an inclined surface such as a concave portion or a convex portion. According to the above publication, it is claimed that the reduction of the exposure defect is achieved by controlling a polarization state to suppress stray light. In addition, according to the above publication, it is described that there is a limit to a focal depth of a projection optical system in a case where a fine pattern with high resolution is formed on the inclined surface, and thus, it is necessary to divide one inclined surface into a plurality of exposure regions and expose the fine pattern.

PRIOR ART DOCUMENT

Patent Document

Patent Document 1: Japanese Patent Application Laid-Open No. 2015-170838

SUMMARY

Problem to be Solved by the Invention

As device structures have been complicated, there is a demand for direct drawing on surfaces having various shapes such as an inclined surface shape and a step shape. A focal depth of a drawing apparatus is, for example, about several µm to several tens of µm, and when a height of the above shape greatly exceeds this, a difference between a drawing pattern and a design pattern is likely to increase due to defocus. In response to this problem, there may be a method of exposing a fine pattern by dividing one inclined surface into a plurality of exposure regions as disclosed in the above publication. In this method, however, it is necessary to complicatedly adjust focus of an optical system to correspond to each of the regions, and as a result, control of the drawing apparatus becomes complicated. In particular, when the height exceeds 100 µm, it is difficult to follow a change in the height with a typical autofocus mechanism for the drawing apparatus.

The present invention has been made to solve the above problems, and an object thereof is to provide a drawing apparatus, a drawing system, and a drawing method capable of drawing with high accuracy on a surface having a shape whose height exceeds a focal depth without complicatedly adjusting a focus of an optical system.

Means to Solve the Problem

A first aspect is a drawing apparatus configured to perform drawing on a substrate based on a design pattern. The drawing apparatus includes a stage, a drawing head, a mover, and a controller. The stage can place the substrate in a posture along the horizontal direction. The drawing head includes: a spatial light modulator that modulates light from a light source to generate modulated light; and a projection optical system that focuses the modulated light on a focus position in a height direction over the stage. The mover relatively moves the stage and the drawing head in the horizontal direction. The controller controls the mover and the drawing head. The controller controls the spatial light modulator based on correction pattern data representing a correction pattern, and the correction pattern data is generated by correcting design pattern data representing a design pattern based on surface profile data representing a surface profile of the substrate.

A second aspect is the drawing apparatus according to the first aspect, in which the correction pattern data is generated by correcting the design pattern data based on a difference in the surface profile from a reference height that is a height of a partial region in the surface profile.

A third aspect is the drawing apparatus according to the second aspect, in which the controller sets a focus position of the drawing head to the reference height.

A fourth aspect is the drawing apparatus according to the second or third aspect, in which the correction pattern data is generated by correcting the design pattern data such that the correction pattern is more reduced relative to the design pattern at a position where the difference in the surface profile from the reference height is larger on the substrate.

A fifth aspect is the drawing apparatus according to any one of the second to fourth aspects, in which the controller controls the mover and the drawing head such that the substrate is exposed based on an exposure amount density distribution, and the exposure amount density distribution has a higher exposure amount density at a position where the difference in the surface profile from the reference height is larger on the substrate.

A sixth aspect is the drawing apparatus according to any one of the second to fifth aspects, in which the partial region of the surface profile is either a portion having a maximum height or a portion having a minimum height in the surface profile.

A seventh aspect is the drawing apparatus according to the sixth aspect, in which the partial region of the surface profile has a larger area of the portion having the maximum height and the portion having the minimum height.

An eighth aspect is the drawing apparatus according to any one of the first to seventh aspects, in which the controller includes a pattern corrector that generates the correction pattern data.

A ninth aspect is a drawing system including the drawing apparatus according to any one of the first to seventh aspects, and a design apparatus including a pattern corrector that generates the correction pattern data.

A tenth aspect is a drawing method configured to perform drawing on a substrate based on a design pattern, the drawing method including: (a) receiving surface profile data representing a surface profile of the substrate; (b) correcting design pattern data representing the design pattern based on the surface profile data to generate correction pattern data representing a correction pattern; (c) placing the substrate on a stage in a posture along a horizontal direction; (d) moving the stage on which the substrate has been placed and a drawing head relative to each other continuously or intermittently in the horizontal direction; (e) generating modulated light by a spatial light modulator included in the drawing head; and (f) irradiating the substrate with the modulated light generated by the spatial light modulator controlled based on the correction pattern data while focusing the modulated light on a focus position in a height direction over the stage by a projection optical system included in the drawing head during execution of the (d) and the (e).

An eleventh aspect is the drawing method according to the tenth aspect, in which the (f) is performed while maintaining a distance between the drawing head and the stage in the height direction.

A twelfth aspect is the drawing method according to the tenth or eleventh aspect, in which the substrate has the surface profile with a level difference of 100 μm or more.

A thirteenth aspect is the drawing method according to the twelfth aspect, in which the level difference is formed by an inclined surface of the substrate, and when a projection of a normal direction of the inclined surface on to a horizontal plane is defined as an inclination direction, resolution of the drawing method is smaller than a dimension of the inclined surface in the inclination direction.

A fourteenth aspect is the drawing method according to the twelfth or thirteenth aspect, in which the design pattern includes a portion extending over the level difference.

A fifteenth aspect is the drawing method according to the fourteenth aspect, in which the portion, of the design pattern, extending over the level difference is a line pattern extending with a constant width, and a portion, of the correction pattern, corresponding to the line pattern extends with a non-constant width due to the surface profile of the substrate having the level difference.

Effects of the Invention

According to each of the above aspects, the correction pattern data is generated by correcting the design pattern data based on the surface profile data of the substrate. The spatial light modulator is controlled based on the correction pattern data. Accordingly, it is possible to perform the drawing with high accuracy on the surface having the shape whose height exceeds the focal depth without complicatedly adjusting the focus of the optical system.

DESCRIPTION OF EMBODIMENTS

Hereinafter, embodiments of the present invention will be described with reference to the drawings. Note that the same or corresponding portions in the following drawings will be denoted by the same reference signs, and the description thereof will not be repeated. In addition, an X axis, a Y axis, and a Z axis in an XYZ orthogonal coordinate system are illustrated in some drawings for easy understanding of a directional relationship between the drawings.

Figure 1:
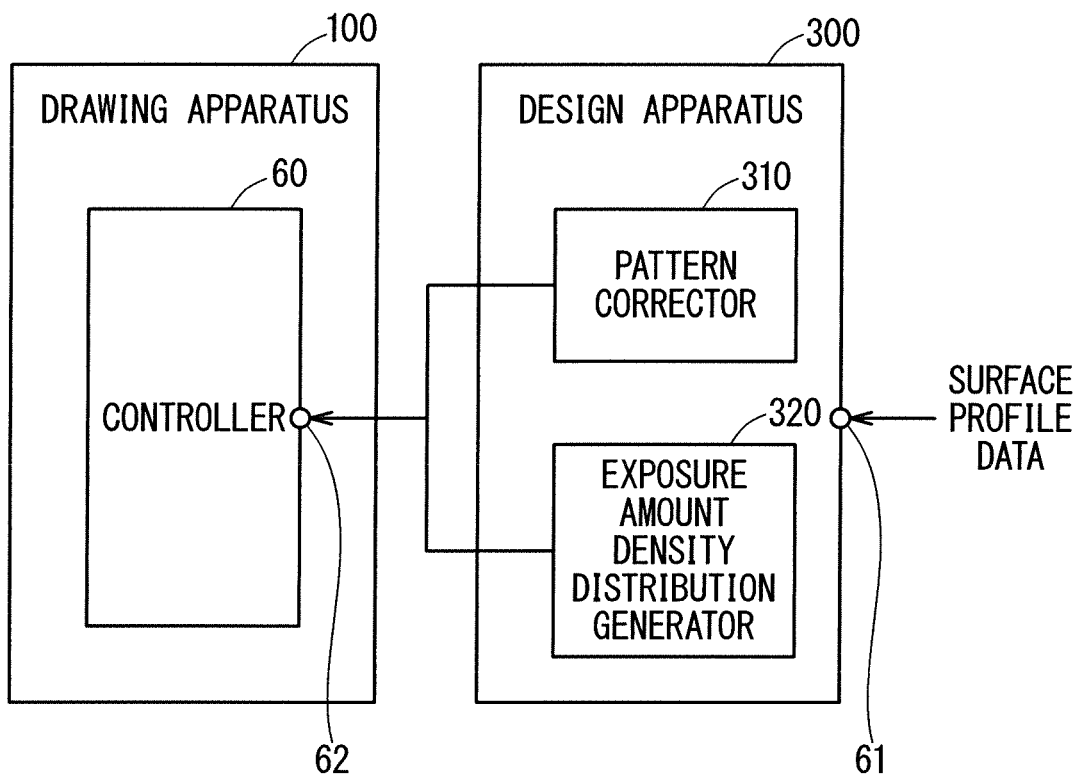
FIG. 1 is a block diagram schematically illustrating a configuration of a drawing system according to an embodiment.

FIG. 1 is a block diagram schematically illustrating a configuration of a drawing system 500 according to an embodiment. The drawing system 500 includes a drawing apparatus 100 and a design apparatus 300. The drawing apparatus 100 is configured to perform drawing on a substrate based on a design pattern. The drawing apparatus 100 includes a controller 60 configured to control each part included therein. The design apparatus 300 is configured to prepare the design pattern, and is, for example, a computer-aided design (CAD) apparatus for designing a wiring pattern. The design apparatus 300 includes a surface profile input part 61 that receives surface profile data indicating a surface shape of the substrate. The surface profile data is prepared based on actual measurement data of the surface of the substrate or design data of the substrate. Note that the design apparatus 300 may generate the surface profile data based on the design data, instead of receiving the surface profile data from the surface profile input part 61. The design apparatus 300 also includes a pattern corrector 310 and an exposure amount density distribution generator 320. The pattern corrector 310 generates correction pattern data to be described later. The exposure amount density distribution generator 320 generates an exposure amount density distribution to be described later. The controller 60 of the drawing apparatus 100 includes a drawing condition input part 62 that receives the correction pattern data and the exposure amount density distribution.

Figure 2:
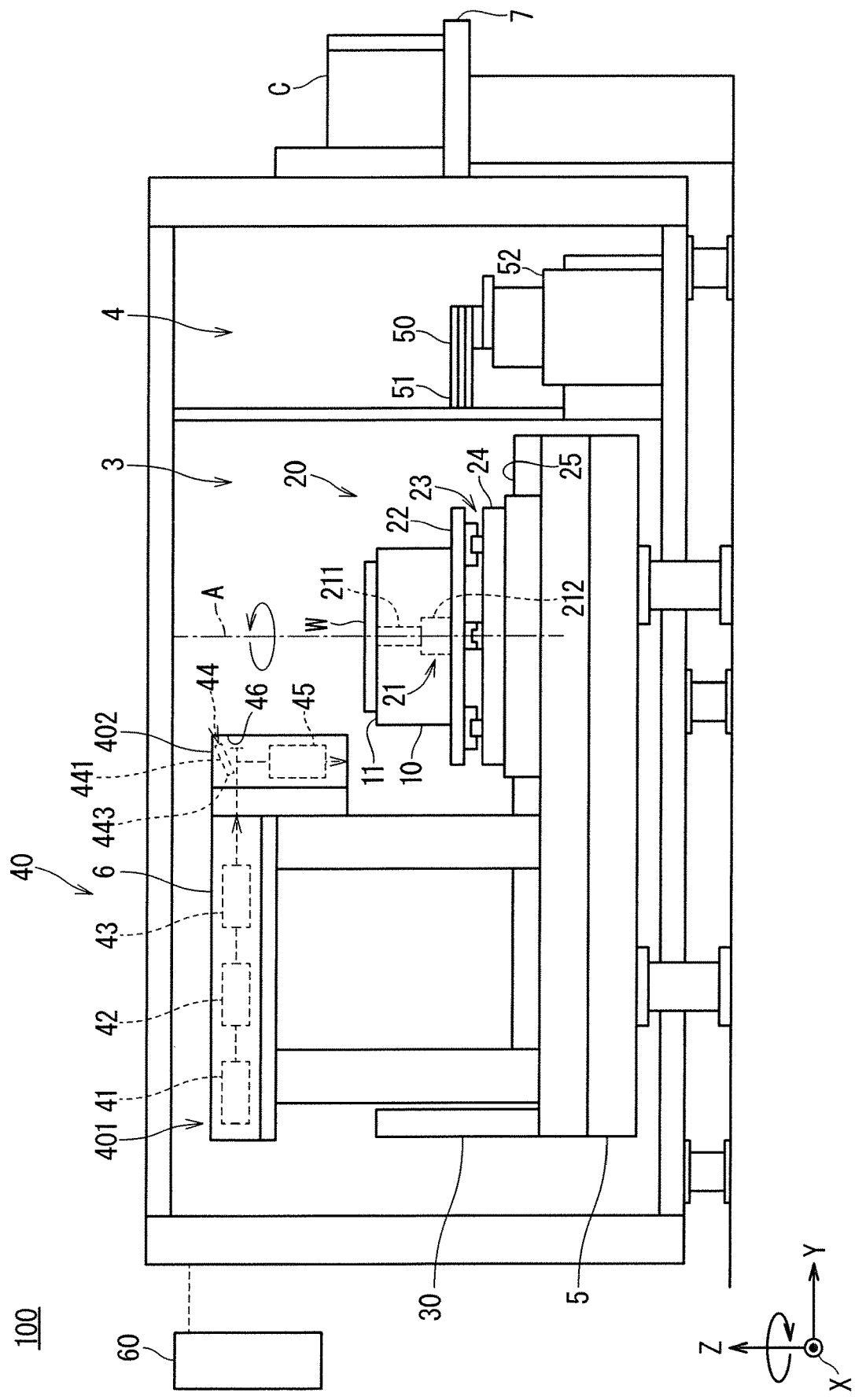
FIG. 2 is a side view schematically illustrating a configuration of a drawing apparatus of FIG. 1.
Figure 3:
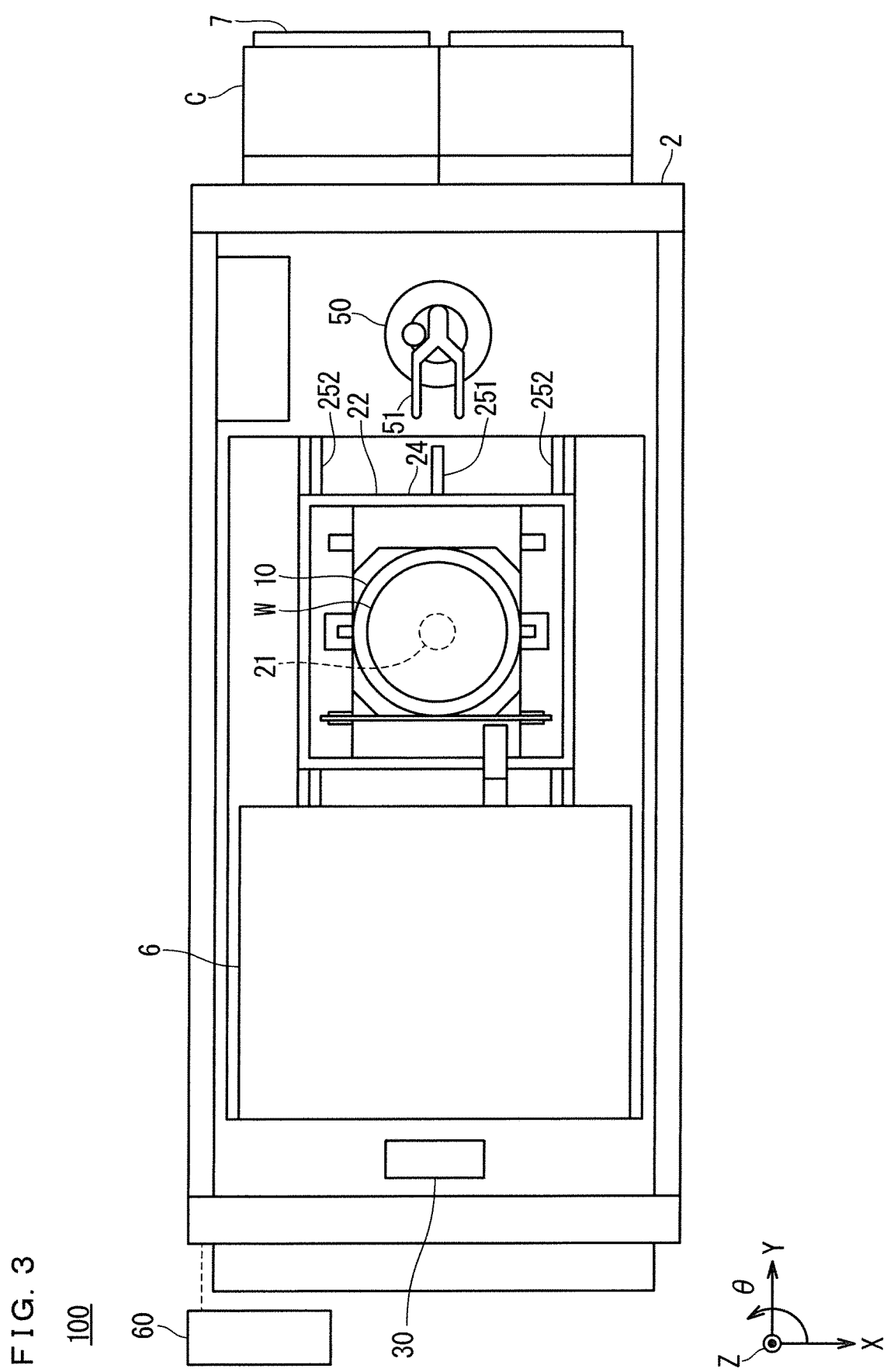
FIG. 3 is a plan view schematically illustrating a configuration of the drawing apparatus of FIG. 1.

FIGS. 2 and 3 are a side view and a plan view, respectively, which schematically illustrate a configuration of the drawing apparatus 100 of FIG. 1. The drawing apparatus 100 irradiates a substrate W on which a photosensitive layer, such as a photoresist, is formed with drawing light modulated according to predetermined data to expose (draw) a pattern, for example, a circuit pattern. The predetermined data is data indicating a pattern such as CAD data. Accordingly, maskless exposure is performed in which the pattern is directly drawn on the photosensitive layer by scanning the photosensitive layer on the substrate W with the drawing light without using a mask. The substrate W is, for example, a silicon wafer, a resin substrate, or a glass-quartz substrate. The substrate W is, for example, a semiconductor substrate, a printed board, a substrate for a color filter, a glass substrate for a flat panel display, a substrate for a magnetic disk, a substrate for an optical disk, or a panel for a solar cell. The substrate for a color filter is provided in, for example, a liquid crystal display apparatus or the like. The glass substrate for a flat panel display is provided in, for example, a liquid crystal display apparatus or a plasma display apparatus. FIG. 3 illustrates a circular semiconductor substrate as the substrate W. Note that a shape of the substrate W is not particularly limited. The substrate W may be formed in, for example, a rectangular shape.

The drawing apparatus 100 includes a main body frame 2. The main body frame 2 constitutes a housing of the drawing apparatus 100. A processing region 3 and a delivery region 4 are formed inside the main body frame 2. The processing region 3 and the delivery region 4 are divided from each other. The drawing apparatus 100 further includes a base 5, a support frame 6, a cassette placement part 7, a stage 10, a driving mechanism 20 (mover), a stage position measuring part 30, an optical unit 40, a conveyance apparatus 50, and the controller 60. The base 5, the support frame 6, the stage 10, the driving mechanism 20, the stage position measuring part 30, and the optical unit 40 are installed in the processing region 3. The conveyance apparatus 50 is installed in the delivery region 4. The cassette placement part 7 is installed outside the main body frame 2. Hereinafter, a configuration of each part included in the drawing apparatus 100 will be described.

The base 5 supports the stage 10. The support frame 6 is installed on the base 5. The support frame 6 supports the optical unit 40.

The stage 10 holds the substrate W. The stage 10 has a flat plate shape. A placement surface 11 on which the substrate W can be placed is formed on an upper surface of the stage 10. A plurality of suction holes (not illustrated) is formed in the placement surface 11 of the stage 10. As a negative pressure (suction pressure) is formed in the suction holes of the stage 10, the substrate W placed on the placement surface 11 of the stage 10 is fixed to the stage 10. As a result, the stage 10 holds the substrate W. The driving mechanism 20 is controlled by the controller 60 to relatively move the stage 10 and the head part 402 in the horizontal direction. Specifically, the driving mechanism 20 moves the stage 10 along a main-scanning direction Y, a sub-scanning direction X, and the rotation direction θ. The main-scanning direction Y is a positive-side direction of the Y axis illustrated in FIGS. 2 and 3. The sub-scanning direction X is a positive-side direction of the X axis illustrated in FIGS. 2 and 3. The rotation direction θ is a rotation direction around the Z axis illustrated in FIGS. 2 and 3. In the present embodiment, the positive-side direction of the Z axis indicates the upper side in the vertical direction. The placement surface 11 of the stage 10 is parallel to each of the X axis and the Y axis, so that the stage 10 can place the substrate W in a posture along the horizontal direction.

The driving mechanism 20 includes a rotation mechanism 21, a support plate 22, a sub-scanning mechanism 23, a base plate 24, and a main-scanning mechanism 25. The rotation mechanism 21 rotates the stage 10. The support plate 22 supports the stage 10 via the rotation mechanism 21. The sub-scanning mechanism 23 moves the support plate 22 along the sub-scanning direction X. The base plate 24 supports the support plate 22 via the sub-scanning mechanism 23. The main-scanning mechanism 25 moves the base plate 24 along the main-scanning direction Y.

The rotation mechanism 21 rotates the stage 10 about a rotation axis A. The rotation axis A is an axis that passes through the center of the stage 10 and is parallel to the Z axis. The rotation mechanism 21 includes, for example, a rotation shaft 211 and a rotational driving part 212. The rotation shaft 211 is fixed to the back side of the placement surface 11 and extends along the Z axis. The rotational driving part 212 includes, for example, a motor. The rotational driving part 212 is provided at a lower end of the rotation shaft 211 and rotates the rotation shaft 211. When the rotational driving part 212 rotates the rotation shaft 211, the stage 10 rotates about the rotation axis A.

The sub-scanning mechanism 23 includes a linear motor. The linear motor includes a movable element and a stator. The movable element is attached to a lower surface of the support plate 22. The stator is laid on an upper surface of the base plate 24. A pair of guide members extending in the sub-scanning direction X is laid on the base plate 24. A ball bearing is installed between each of the guide members and the support plate 22. The ball bearing slides along the guide member. The support plate 22 is supported by the pair of guide members via the ball bearings. When the linear motor operates, the support plate 22 moves along the sub-scanning direction X while being guided by the guide members.

The main-scanning mechanism 25 includes a linear motor 251. The linear motor 251 includes a movable element and a stator. The movable element is attached to a lower surface of the base plate 24. The stator is laid on the base 5 of the drawing apparatus 100. A pair of guide members 252 extending in the main-scanning direction Y is laid on the base 5. For example, an air bearing is installed between each of the guide members 252 and the base plate 24. Air is supplied from utility equipment to the air bearing. The base plate 24 floats on the guide members 252 by the air bearings. As a result, the base plate 24 is supported in a non-contact state with respect to the guide members 252. When the linear motor 251 operates, the base plate 24 moves along the main-scanning direction Y while being guided by the guide member 252. At this time, generation of friction between the base plate 24 and the guide member 252 is avoided.

The stage position measuring part 30 measures a position of the stage 10. The stage position measuring part 30 includes, for example, a laser interferometric length measuring machine. For example, the stage position measuring part 30 emits a laser beam from the outside of the stage 10 toward the stage 10, and receives the laser beam reflected by the stage 10. Then, the stage position measuring part 30 measures the position of the stage 10 from the interference between the laser light emitted toward the stage 10 and the laser light reflected by the stage 10. The position of the stage 10 indicates a position in the main-scanning direction Y and a position in the rotation direction θ.

The optical unit 40 irradiates the substrate W held on the stage 10 with drawing light to draw a pattern on the substrate W. The pattern is a general pattern such as a hole, a trench, and a gate. The optical unit 40 includes a light source part 401 and a head part 402 (drawing head), each of which is controlled by the controller 60. The light source part 401 is installed on the support frame 6. The head part 402 is accommodated inside an attached box attached to the support frame 6.

The light source part 401 functions as a laser light source that emits I-rays. The light source part 401 includes a laser driving part 41, a laser oscillator 42, and an illumination optical system 43. The laser oscillator 42 is driven by the laser driving part 41, and emits a spot beam, which is a laser beam, from an output mirror (not illustrated). The spot beam is incident on the illumination optical system 43. The illumination optical system 43 generates linear light from the spot beam. The linear light is a line beam having a substantially uniform intensity distribution and a strip-shaped light flux cross section. The line beam is incident on the head part 402. Hereinafter, the line beam incident on the head part 402 is sometimes described as incident light. Note that it may be configured such that a light amount of the incident light is adjusted by applying an aperture to the incident light at a stage before the incident light is incident on the head part 402.

The incident light is subjected to spatial modulation according to pattern data in the head part 402. Spatially modulating the incident light indicates changing a spatial distribution of the incident light. The spatial distribution of the incident light indicates, for example, an amplitude of the light, a phase of the light, and/or polarization. The spatial distribution of the incident light is generated, for example, by rasterizing the design data of the pattern generated using CAD. The pattern data is information in which information indicating irradiation positions of the drawing light with respect to the substrate W are recorded in units of pixels. The drawing apparatus 100 acquires the information indicating the pattern data in advance. In the present embodiment, the drawing apparatus 100 acquires the pattern data by receiving the information indicating the pattern data from the design apparatus 300 (FIG. 1) via a network. The drawing apparatus 100 may acquire the pattern data by reading the information indicating the pattern data from a recording medium connected to the drawing apparatus 100.

The head part 402 includes a spatial light modulation unit 44, a projection optical system 45, and a mirror 46. The incident light incident on the head part 402 is incident on the spatial light modulation unit 44 at a predetermined angle via the mirror 46. The spatial light modulation unit 44 includes a spatial light modulator 441.

The spatial light modulator 441 modulates light from the light source part 401 to generate modulated light. Specifically, the spatial light modulator 441 spatially modulates incident light to separate the incident light into the drawing light and unnecessary light. Then, the spatial light modulator 441 emits the drawing light for a plurality of pixels along the sub-scanning direction X. The drawing light indicates light contributing to pattern drawing. The unnecessary light indicates light that does not contribute to pattern drawing.

The spatial light modulator 441 is, for example, a light modulation element of a diffraction grating type in which a fixed ribbon and a flexible ribbon are disposed. The light modulation element of the diffraction grating type is a diffraction grating capable of changing a grating depth, and is manufactured using, for example, a semiconductor device manufacturing technique. The light modulation element of the diffraction grating type is a grating light valve (GLV) ("GLV" is a registered trademark) in the present embodiment. In the GLV, for example, 8000 mirrors are formed over a width of 4 mm, and control is performed for each modulation measure including four mirrors. In this case, since 2000 modulation measures are provided in the range of 4 mm, the minimum resolution in the width direction is 4 mm/2000=2 µm. Note that the light modulation element is not limited to the GLV, and may be, for example, a digital mirror device (DMD). Note that an exposure width by the modulated light from the light modulation element can be adjusted by a configuration of an optical system.

The drawing apparatus 100 has a gradation exposure function. Specifically, the controller 60 controls the driving mechanism 20 and the head part 402 such that the substrate W is exposed based on the exposure amount density distribution. When the light modulation element is the GLV, a gradation can be adjusted in a range of 0% to 100%. The adjustment may be performed with any percentage, but is typically controlled in discrete gradations of about several stages including 0% and 100%. When the movable ribbon is sufficiently lowered, 0% is realized. When the movable ribbon is sufficiently raised, 100% is realized. When the movable ribbon is located in the middle, 50% is realized. On the other hand, when the light modulation element is DMD, the gradation exposure can be performed by adjusting the number of times of light irradiation and/or an irradiation time.

The spatial light modulator 441 includes a plurality of modulation measures 442 (see FIG. 5) and a driver circuit unit 443. The plurality of modulation measures 442 are arranged along the sub-scanning direction X. The driver circuit unit 443 applies a voltage to each of the plurality of modulation measures 442. The driver circuit unit 443 can independently control the voltage applied to each of the plurality of modulation measures 442. The driver circuit unit 443 can switch a state of the modulation measure 442 to any state of an OFF state or an ON state. The OFF state indicates a state in which no voltage is applied to the modulation measure 442. The ON state indicates a state in which a voltage is applied to the modulation measure 442.

When the modulation measure 442 is set to the OFF state, the surface of the modulation measure 442 is a planar surface because the flexible ribbon does not bend. When incident light enters the planar surface of the modulation measure 442, the incident light is specularly reflected without being diffracted. The incident light is specularly reflected to become drawing light that is zero-order diffracted light. As being emitted from the modulation measure 442, the drawing light reaches the substrate W. When the modulation measure 442 is set to the ON state, the flexible ribbon bends so that a groove is formed on the surface of the modulation measure 442. When incident light enters the groove of the modulation measure 442, the incident light is diffracted. The incident light is diffracted to become unnecessary light that is non-zero-order diffracted light. As being emitted from the modulation measure 442, the unnecessary light does not reach the substrate W. Hereinafter, the groove formed on the surface of the modulation measure 442 is sometimes described as a surface groove.

The driver circuit unit 443 can change a depth of the surface groove by changing the voltage applied to the modulation measure 442. A light amount of the drawing light is adjusted by changing the depth of the surface groove. The controller 60 controls the driver circuit unit 443 to adjust an emission rate of the drawing light for each of the modulation measures 442. The emission rate of the drawing light indicates a ratio of the amount of emitted light to the amount of incident light (the amount of emitted light/the amount of incident light). The amount of incident light indicates a light amount of incident light incident on the modulation measure 442. The amount of emitted light indicates a light amount of the drawing light emitted from the modulation measure 442. When the modulation measure 442 is in the OFF state, that is, when the surface of the modulation measure 442 is a planar surface, the emission rate of the drawing light is an emission rate 100%. When the surface groove is formed in the surface of the modulation measure 442, the emission rate decreases. The emission rate decreases as the surface groove is deeper. The controller 60 controls the driver circuit unit 443 to change the depth of the surface groove, thereby adjusting the emission rate of the drawing light between an emission rate 0% and the emission rate 100%.

The drawing light emitted from the modulation measure 442 is incident on the projection optical system 45. The projection optical system 45 guides the drawing light out of light incident from the spatial light modulator 441 to the substrate W. The projection optical system 45 focuses the modulated light on a focus position in the height direction over the stage 10. The projection optical system 45 includes, for example, a shielding plate. The shielding plate is a plate-shaped member in which a through-hole is formed. The drawing light passes through the through-hole. As a result, the drawing light reaches the substrate W. On the other hand, the unnecessary light does not pass through the through-hole and reaches the shielding plate. As a result, the unnecessary light is blocked from reaching the substrate W by the shielding plate. When the drawing light reaches the substrate W, a pattern is drawn on the substrate W. The drawing light emitted from one modulation measure 442 forms one pixel of the pattern drawn on the substrate W. The projection optical system 45 may be a reduction projection optical system. The projection optical system 45 may include a zoom lens and/or an objective lens, and the zoom lens constitutes a zoom part that adjusts a width of the drawing light. Adjusting the width of the drawing light indicates increasing the width of the drawing light and/or decreasing the width of the drawing light. The objective lens forms an image of the drawing light on the substrate W at a predetermined magnification.

The conveyance apparatus 50 carries the substrate W into the processing region 3 and carries the substrate W out of the processing region 3. The conveyance apparatus includes a plurality of hands 51 and a hand driving mechanism 52. The hand 51 conveys the substrate W. The hand driving mechanism 52 drives the hand 51. The unprocessed substrate W is accommodated in the cassette placement part 7. The conveyance apparatus 50 takes the substrate W out of the cassette placement part 7 and carries the substrate W into the processing region 3, and carries the processed substrate W out of the processing region 3 and accommodates the processed substrate W in the cassette C.

Figure 4:
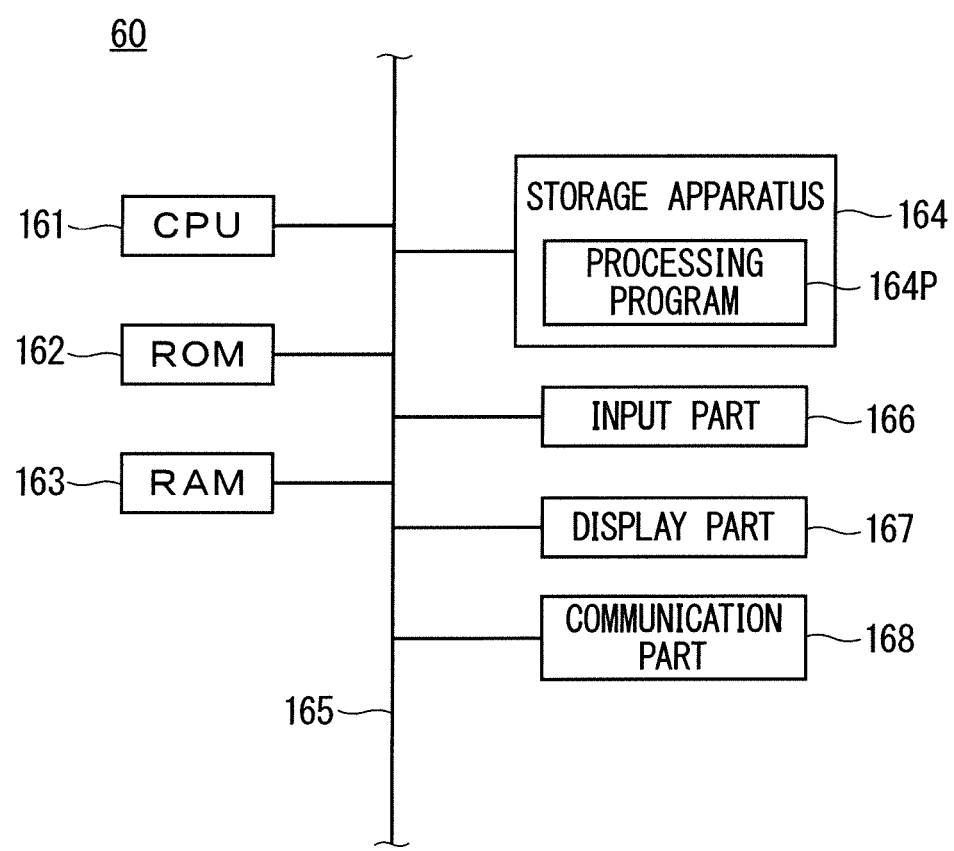
FIG. 4 is a plan view schematically illustrating a configuration of a controller of FIG. 1.

FIG. 4 is a plan view schematically illustrating a configuration of the controller 60 of FIG. 1. The controller 60 may be configured using one or a plurality of general computers having an electric circuit. In a case where a plurality of computers is used, the computers are connected to be capable of communicating with each other. The controller may be disposed in one electric rack (not illustrated). Specifically, the controller 60 includes a central processing unit (CPU) 161, a read only memory (ROM) 162, a random access memory (RAM) 163, a storage apparatus 164, an input part 166, a display part 167, a communication part 168, and a bus line 165 that connects these to one another. The ROM 162 stores a basic program. The RAM 163 is used as a work area when the CPU 161 performs predetermined processing. The storage apparatus 164 includes a non-volatile storage apparatus such as a flash memory or a hard disk apparatus. The input part 166 includes various switches, a touch panel, a recording medium reading apparatus, or the like, and receives an input setting instruction such as a processing recipe from an operator. The display part 167 includes, for example, a liquid crystal display apparatus, a lamp, and the like, and displays various types of information under the control of the CPU 161. The communication part 168 has a data communication function via a local area network (LAN) or the like. Accordingly, the communication part 168 can receive data from the design apparatus 300 (FIG. 1). In the storage apparatus 164, a plurality of modes regarding control of each configuration in the drawing apparatus 100 are set in advance. When the CPU 161 executes a processing program 164P, one of the plurality of modes is selected, and each configuration is controlled in the mode. Note that the processing program 164P may be stored in a recording medium. When this recording medium is used, the processing program 164P can be installed in the controller 60. In addition, some or all of the functions executed by the controller 60 are not necessarily implemented by software, and may be implemented by hardware such as a dedicated logic circuit.

The drawing condition input part 62 (FIG. 1) may include the communication part 168 or the input part 166. Note that the design apparatus 300 may also have a hardware configuration similar to that in FIG. 4. In this case, the surface profile input part 61 (FIG. 1) may be configured using the communication part 168 or the input part 166 in a similar hardware configuration.

Figure 5:
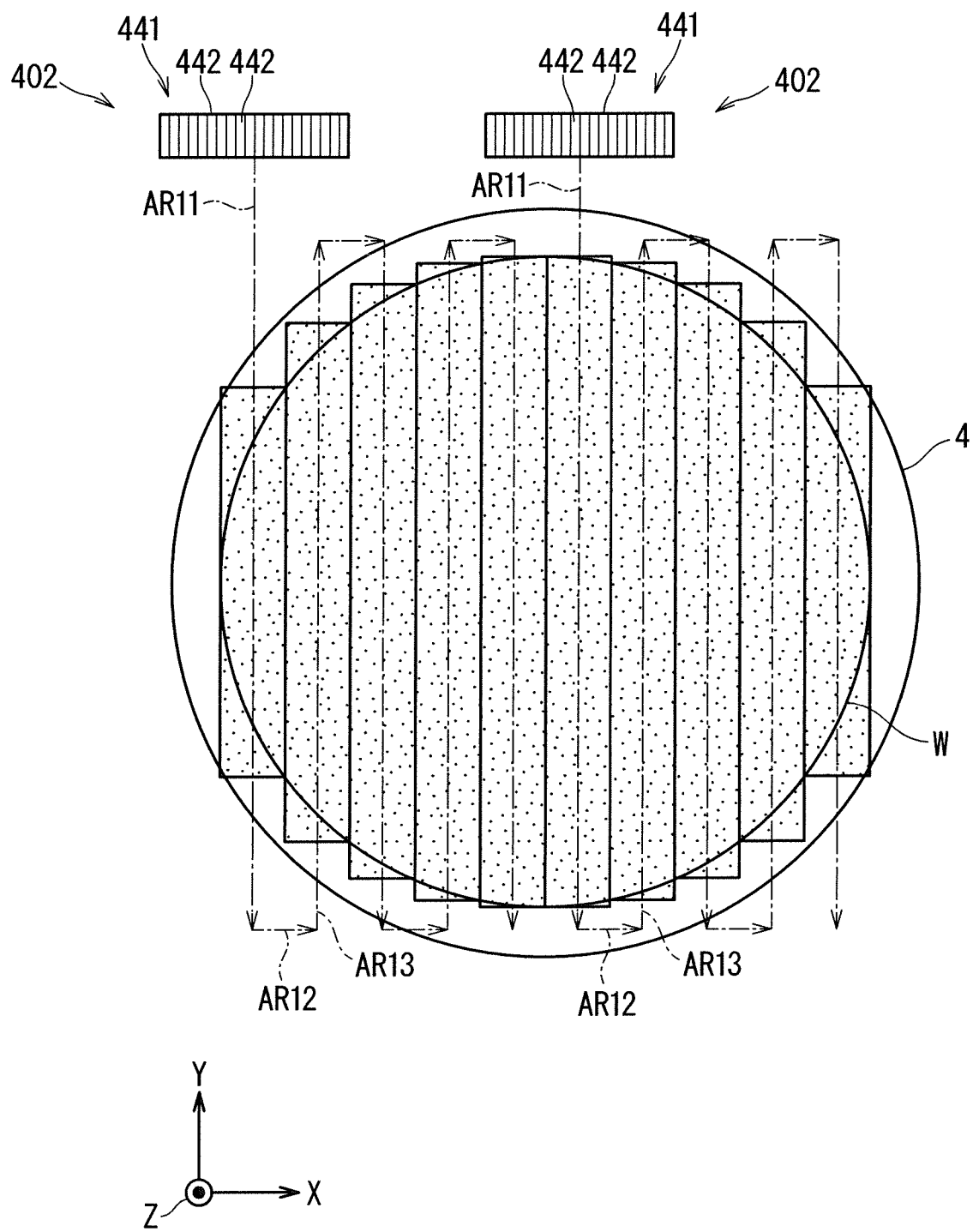
FIG. 5 is a plan view schematically illustrating exposure scanning in a drawing method according to an embodiment.

FIG. 5 is a plan view schematically illustrating exposure scanning in a drawing method according to an embodiment. Note that FIG. 5 illustrates a case where two head parts 402 are used, but any number of the head parts 402 may be used.

In the exposure scanning, the driving mechanism 20 moves the stage 10 in a forward direction (here, exemplified as the +Y direction) along the main-scanning direction (Y direction) to relatively move the substrate W along a main-scanning axis with respect to each of the head parts 402 (forward main-scanning). When viewed from the substrate W, each of the head parts 402 traverses the substrate W in the −Y direction along the main-scanning axis as indicated by an arrow AR11. In addition, as the forward main-scanning is started, the drawing light is emitted from each of the head parts 402. That is, pattern data (specifically, a portion, which describes data that needs to be drawn in a stripe region to be drawn by the forward main-scanning, of the pattern data) is read, and the spatial light modulator 441 is controlled according to the pattern data. Then, drawing light subjected to spatial modulation according to the pattern data is emitted from each of the head parts 402 toward the substrate W.

When each of the head parts 402 traverses the substrate W once along the main-scanning axis while emitting the drawing light intermittently or continuously toward the substrate W, a pattern group is drawn in one stripe region (region extending along main-scanning axis and having a width along sub-scanning axis corresponding to a width of the drawing light). Here, pattern groups are drawn in two stripe regions, respectively, by one forward main-scanning since the two head parts 402 simultaneously traverse the substrate W.

When the forward main-scanning involving the irradiation of the drawing light is completed, the driving mechanism 20 moves the stage 10 in a predetermined direction (for example, in the −X direction) along the sub-scanning direction (X direction) by a distance corresponding to the width of the drawing light. Accordingly, the substrate W moves relative to each of the head parts 402 along the sub-scanning direction (sub-scanning). When viewed from the substrate W, each of the head parts 402 moves in the +X direction along the sub-scanning direction by the width of the stripe region as indicated by an arrow AR12.

When the sub-scanning is completed, backward main-scanning involving the irradiation of the drawing light is executed. That is, the driving mechanism 20 moves the stage 10 in the backward direction (here, in the −Y direction) along the main-scanning direction (Y direction). Accordingly, the substrate W moves relative to each of the head parts 402 along the main-scanning direction (backward main-scanning). When viewed from the substrate W, each of the head parts 402 moves in the +Y direction along the main-scanning direction on the substrate W to traverse the substrate W as indicated by an arrow AR13. In the meantime, when the backward main-scanning is started, the irradiation of the drawing light is started from each of the head parts 402. This backward main-scanning causes pattern groups to be drawn in stripe regions respectively adjacent to the stripe regions subjected to the drawing in the previous forward main-scanning.

When the backward main-scanning involving the irradiation of the drawing light ends, sub-scanning is performed, and then, the forward main-scanning involving the irradiation of the drawing light is performed again. This forward main-scanning causes pattern groups to be drawn in stripe regions respectively adjacent to the stripe regions subjected to the drawing in the previous backward main-scanning. Thereafter, similarly, the main-scanning involving the irradiation of the drawing light is repeatedly performed while interposing the sub-scanning, and when the pattern is drawn in the entire region of the drawing target region, the drawing processing for one piece of the pattern data ends.

Next, prior to exemplification of the drawing method in the present embodiment, a drawing method in a comparative example will be exemplified.

Figure 6:
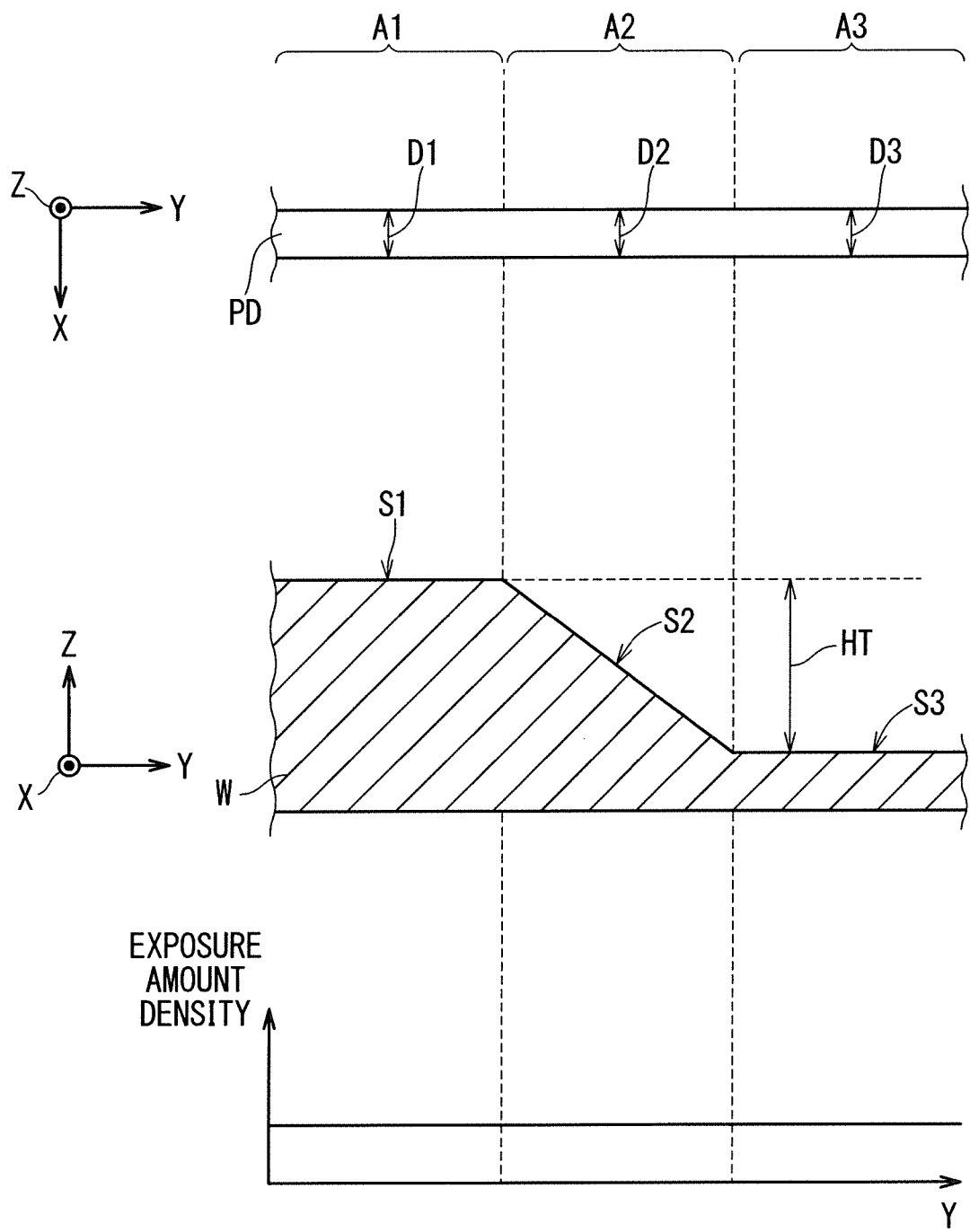
FIG. 6 is a view illustrating a combination of a plan view (in the upper part of the drawing) of a design pattern, a cross-sectional view (in the middle part of the drawing) of a substrate, and an exposure amount density distribution (in the lower part of the drawing) in a comparative example.

FIG. 6 is a view illustrating a combination of a plan view (in the upper part of the drawing) of a design pattern PD, a cross-sectional view (in the middle part of the drawing) of a substrate W, and an exposure amount density distribution (in the lower part of the drawing) in the comparative example. A surface profile of the substrate W includes a portion (highest surface S1) having a maximum height, a portion (lowest surface S3) having a minimum height, and a portion (inclined surface S2) connecting these portions. In the illustrated example, the substrate W has the surface profile having a level difference HT of 100 μm or more due to the inclined surface S2. As illustrated in the upper part and the middle part of FIG. 6, the design pattern PD has a portion extending over the level difference HT. A portion of the design pattern PD extending over the level difference HT is a line pattern extending with a constant width. Note that the surface of the substrate W is a photosensitive surface by forming a photoresist layer (not illustrated) sufficiently thinner than the level difference HT. The design pattern PD has a portion A1, a portion A2, and a portion A3 located on the highest surface S1, the inclined surface S2, and the lowest surface S3, respectively, and widths (dimensions in the X direction) D1 to D3 of the portions A1 to A3 are the same. In other words, the design pattern PD is a line pattern extending with a constant width along the Y direction. Focus positions of the head parts 402 in the Z direction of the design pattern PD are set on the highest surface S1. An exposure amount density is uniform in the present comparative example. Note that the exposure amount density (mJ/cm$^2$) is a product of illuminance (mW/cm$^2$) and time (s).

Figure 7:
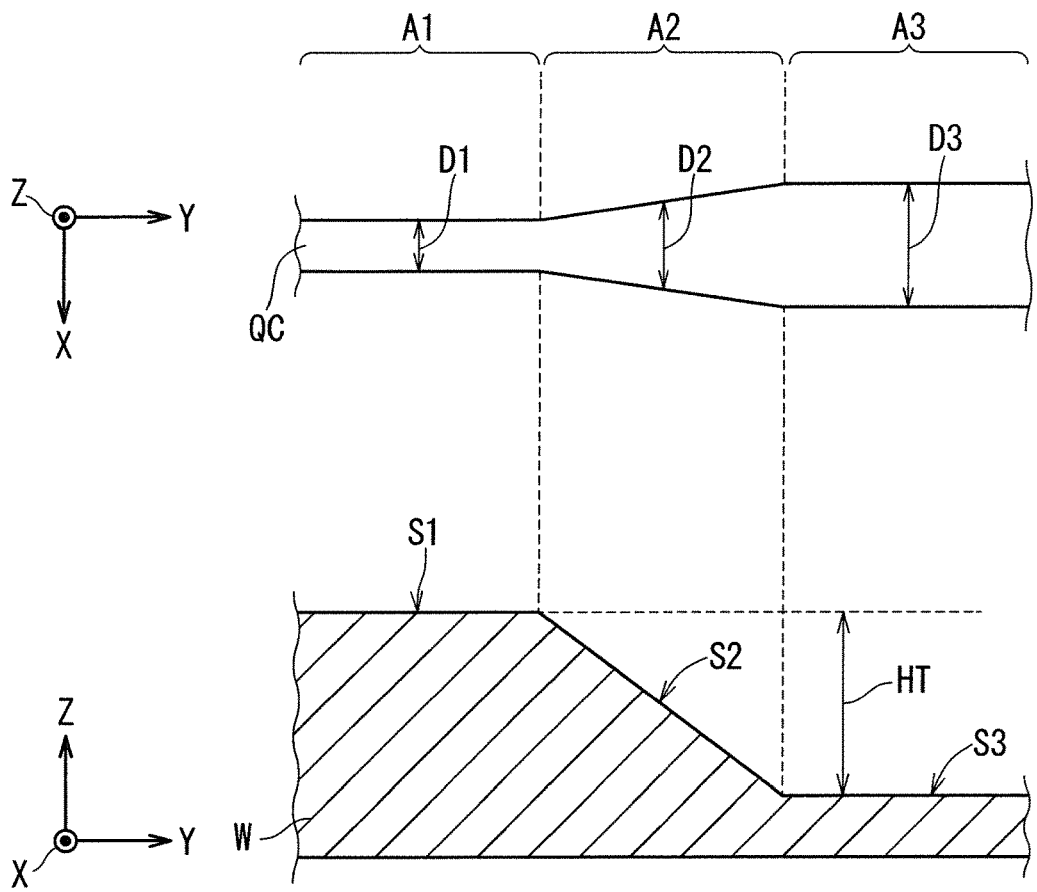
FIG. 7 is a view illustrating a plan view (in the upper part of the drawing) of a drawing pattern and a cross-sectional view (in the lower part of the drawing) of the substrate in the comparative example.

FIG. 7 is a view illustrating a plan view (in the upper part of the drawing) of a drawing pattern QC drawn on the substrate W and a cross-sectional view (in the lower part of the drawing) of the substrate W in the comparative example. As illustrated in the drawing, in the drawing pattern QC, the portion A1 has the width D1 similarly to that of the design pattern PD, the portion A3 has the width D3 enlarged from the width D1, and the portion A2 between the portion A1 and the portion A3 has the width D2 gradually enlarged from the width D1 to the width D3.

Figure 8:
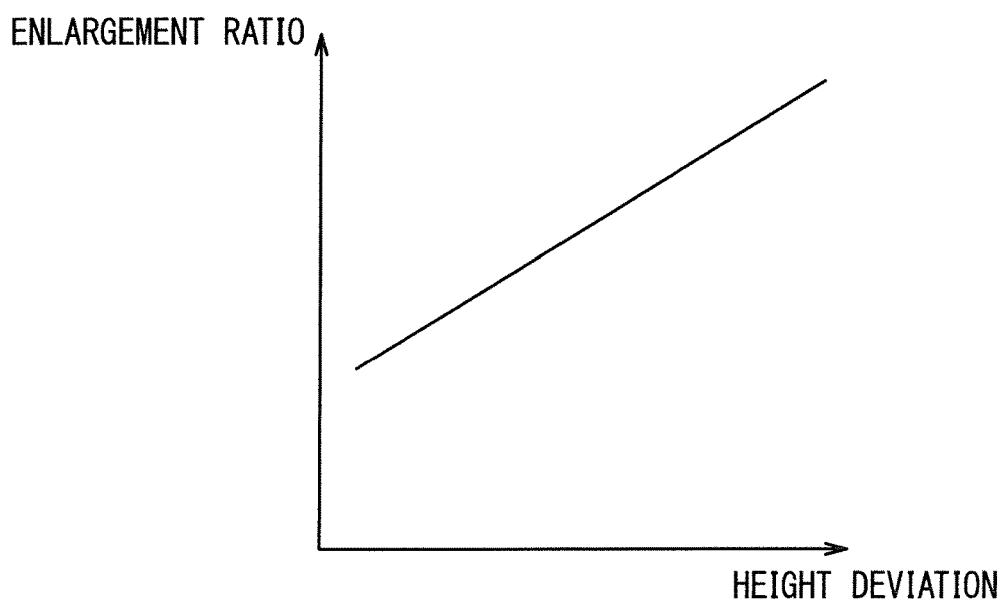
FIG. 8 is a graph illustrating an example of a relationship between a height deviation of focus and an enlargement ratio from a design pattern to a drawing pattern.

FIG. 8 is a graph schematically illustrating a relationship between a height deviation of focus and an enlargement ratio from the design pattern PD to the drawing pattern QC. The enlargement of the width as described above is caused by defocus due to a height deviation from the highest surface S1 corresponding to the focus position. Due to this defocus, the drawing pattern QC (in the upper part of FIG. 7) is greatly different from the design pattern PD (in the upper part of FIG. 6).

Figure 9:
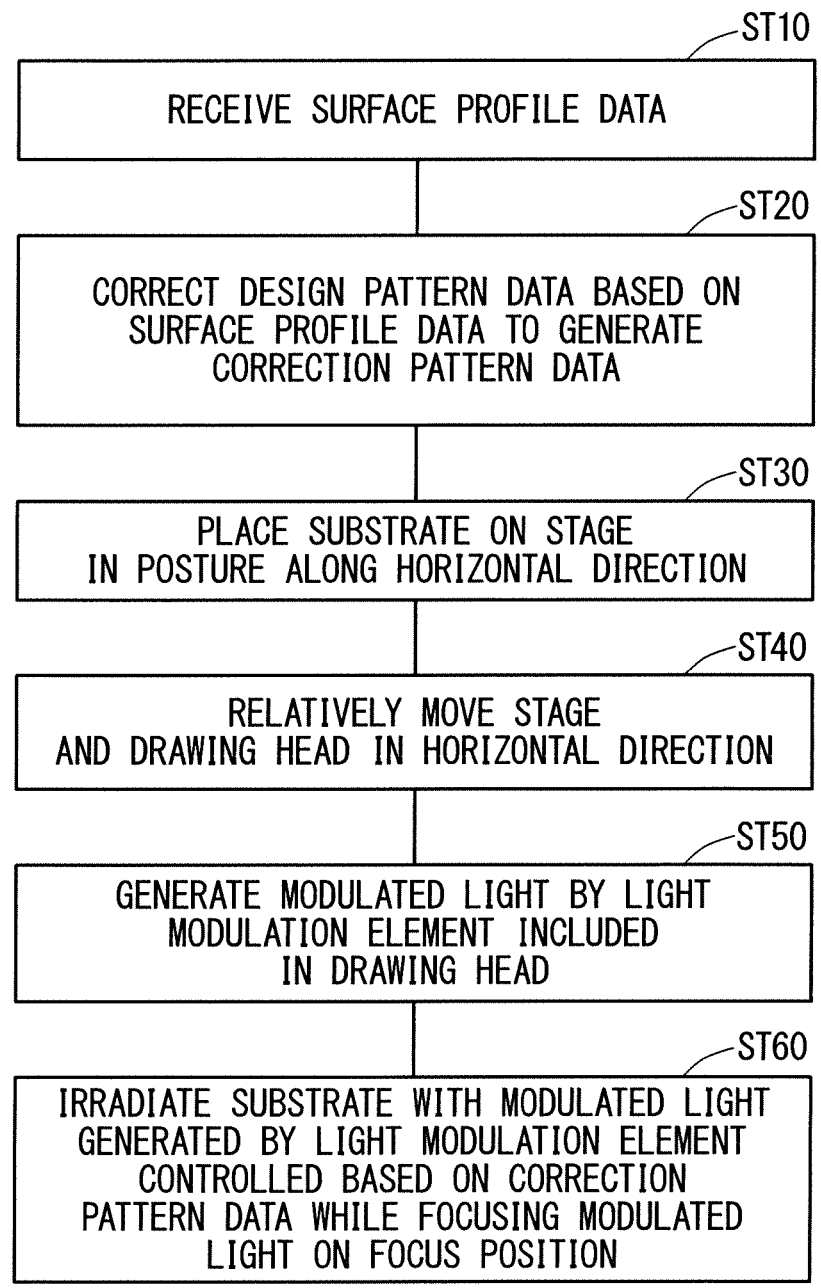
FIG. 9 is a flowchart schematically illustrating a drawing method according to an embodiment.
Figure 10:
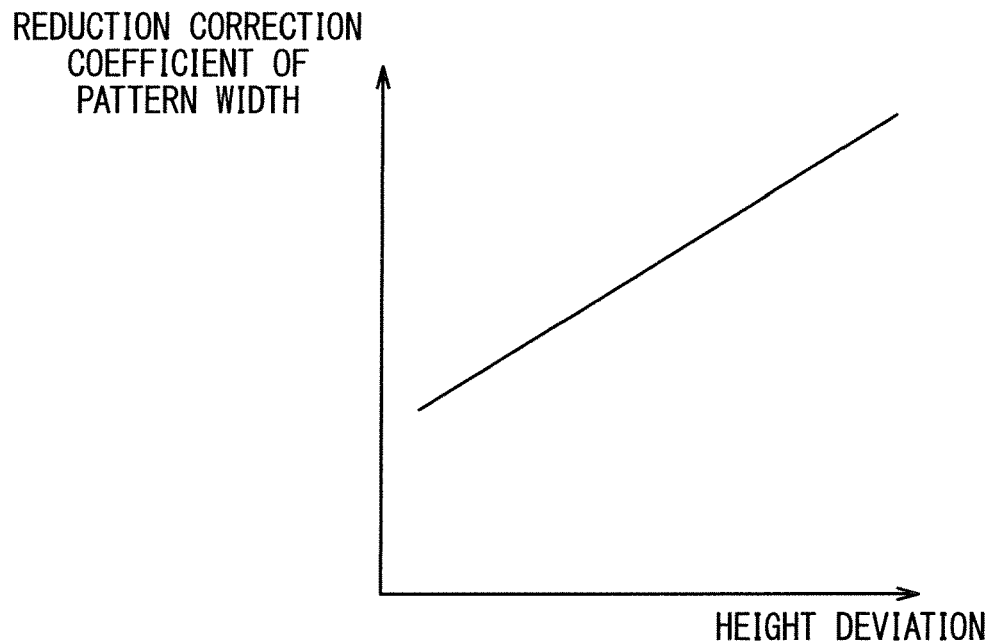
FIG. 10 is a graph illustrating an example of a reduction correction coefficient used to generate a correction pattern by reducing a design pattern in the drawing method of FIG. 9.
Figure 11:
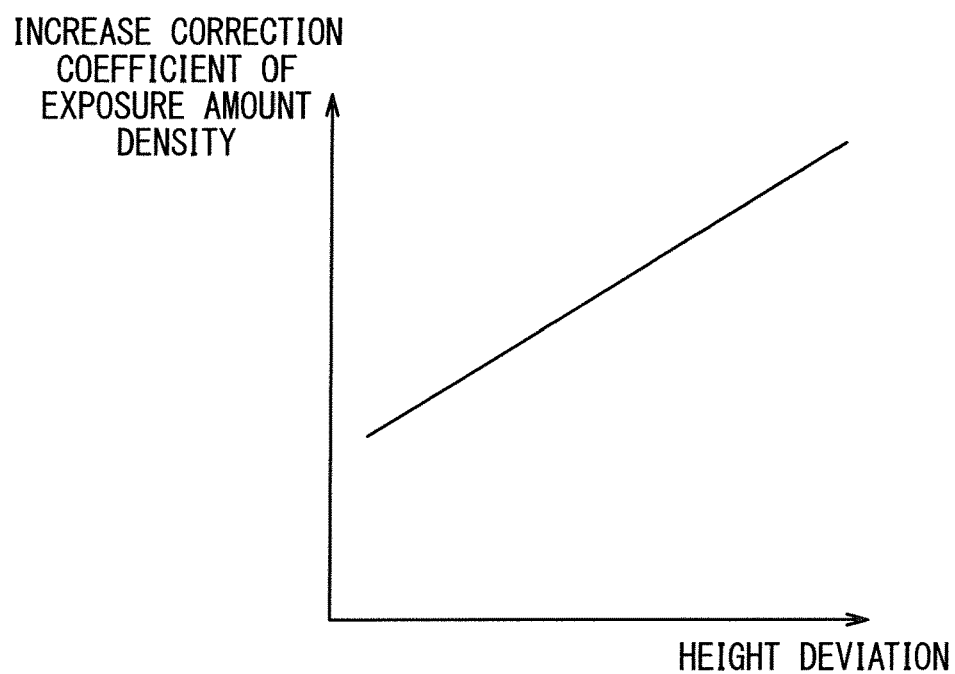
FIG. 11 is a graph illustrating an example of an increase correction coefficient of an exposure amount density in the drawing method of FIG. 9.

Next, the drawing method in the present embodiment will be exemplified. FIG. 9 is a flowchart schematically illustrating the drawing method. FIG. 10 is a graph schematically illustrating a reduction correction coefficient used to generate a correction pattern PC (in the upper part of FIG. 12) by reducing the design pattern PD (in the upper part of FIG. 6), and the reduction correction coefficient may be substantially the enlargement ratio (FIG. 8) described in the above comparative example. FIG. 11 is a graph illustrating an example of an increase correction coefficient of the exposure amount density, and the increase correction coefficient may be substantially the enlargement ratio (FIG. 8) described in the above comparative example. Note that each of the coefficients in FIGS. 10 and 11 has a linear dependency on a height deviation, but may have a more complex dependency. The dependency may be stored in the pattern corrector 310 and the exposure amount density distribution generator 320 as table data or function data.

In Step ST10 (FIG. 9), the surface profile input part 61 (FIG. 1) receives the surface profile data representing the surface profile of the substrate W.

Figure 12:
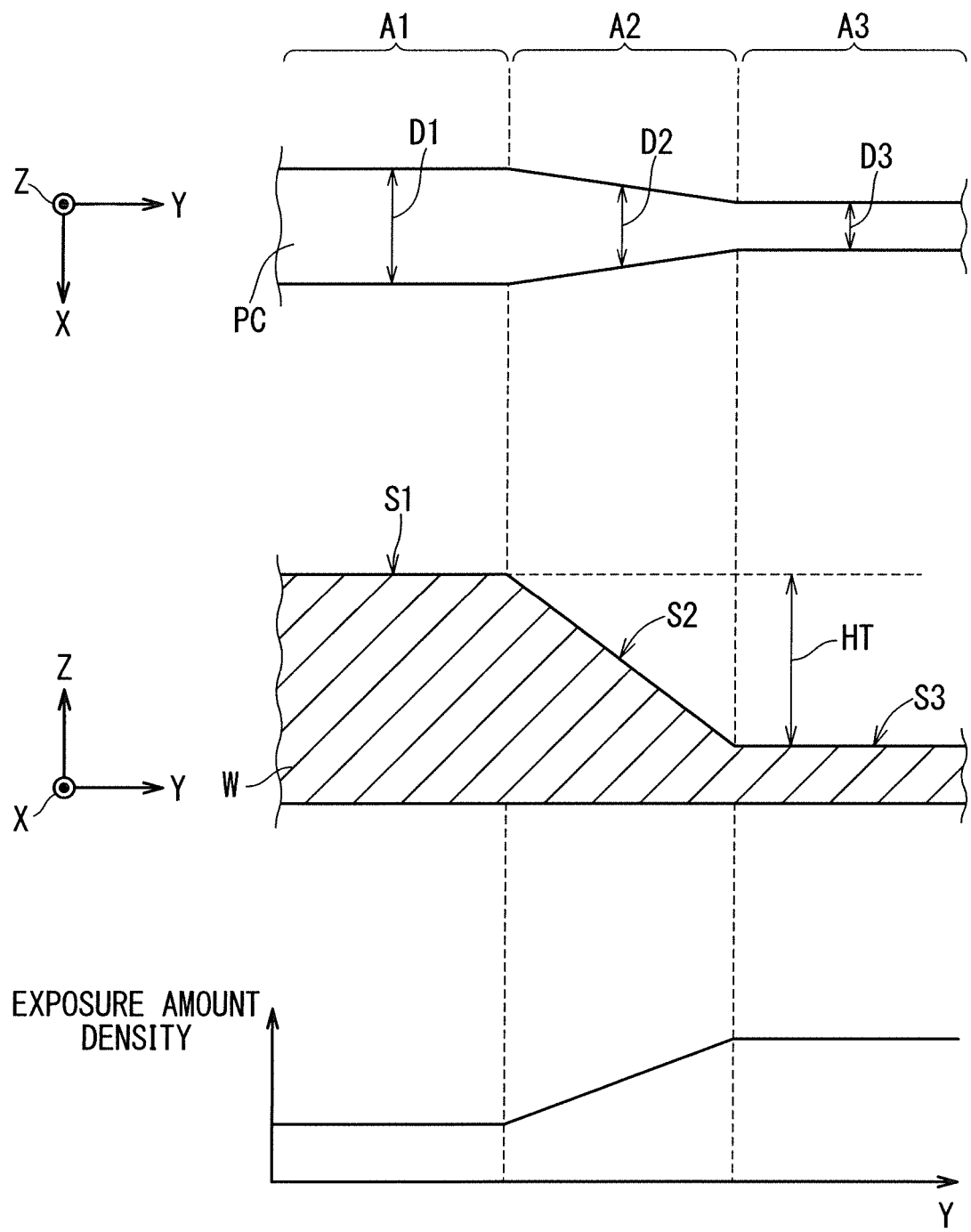
FIG. 12 is a view illustrating a combination of a plan view (in the upper part of the drawing) of a design pattern, a cross-sectional view of a substrate (in the middle part of the drawing), and an exposure amount density distribution (in the lower part of the drawing) in the drawing method of FIG. 9.

In Step ST20 (FIG. 9), the pattern corrector 310 corrects the design pattern data representing the design pattern PD (the upper part of FIG. 6) based on the surface profile data. Specifically, first, a difference in the surface profile from a reference height, which is a height of a partial region (in this example, the highest surface S1) in the surface profile, is read. Correction for reducing a width (more generally speaking, dimension) of the design pattern PD is performed based on the difference and the reduction correction coefficient (FIG. 10). By this correction, the pattern corrector 310 generates the correction pattern data representing the correction pattern PC (in the upper part of FIG. 12). By this correction, the correction pattern PC (in the upper part of FIG. 12) is more reduced relative to the design pattern PD (in the upper part of FIG. 6) at a position where the difference is larger on the substrate W. A portion (the entire portions A1 to A3) of the correction pattern PC corresponding to the line pattern in the design pattern PD (the upper part of FIG. 6) extends with a non-constant width as illustrated in FIG. 12 due to the surface profile of the substrate W having the level difference HT.

Furthermore, the exposure amount density distribution generator 320 generates the exposure amount density distribution based on the above-described difference, a standard exposure amount density, and the increase correction coefficient (FIG. 11) in the present embodiment. The standard exposure amount density may be an optimal exposure amount density when there is substantially no influence of defocus. In the exposure amount density distribution, the exposure amount density is higher at a position where the difference is larger on the substrate W. Note that FIG. 12 illustrates a continuous change in the exposure amount density, but gradation exposure corresponding to a discrete change approximating such a continuous change may be performed. For example, in a case where it is possible to perform gradation exposure in five stages of 0%, 25%, 50%, 75%, and 100%, exposure amount densities of 50%, 75%, and 100% may be applied to each of the portion A1, the portion A2, and the portion A3.

In Step ST30 (FIG. 9), the substrate W is placed on the stage 10 in the posture along the horizontal direction as illustrated in FIG. 2. Note that Step ST30 is performed at any timing as long as being performed before Step ST40 to be described later.

Next, the exposure scanning is performed as described above with reference to FIG. 5. Specifically, in Step ST40 (FIG. 9), the stage 10 on which the substrate W has been placed and the head part 402 are relatively moved in the horizontal direction continuously or intermittently. In Step ST50 (FIG. 9), modulated light is generated by the spatial light modulator 441 included in the head part 402.

In Step ST60 (FIG. 9), the modulated light is emitted to the substrate W while being focused on the focus position in the height direction over the stage 10 by the projection optical system 45 with execution of Steps ST40 and ST50. The modulated light is generated by the spatial light modulator 441 controlled by the controller 60 based on the correction pattern data. The focus position of the head part 402 is set to the above-described reference height (here, height of the highest surface S1) by the controller 60. Therefore, Step ST60 is performed while maintaining a distance between the head part 402 and the stage 10 in the height direction. The distance is also maintained when the scanning passes through the level difference HT.

Figure 13:
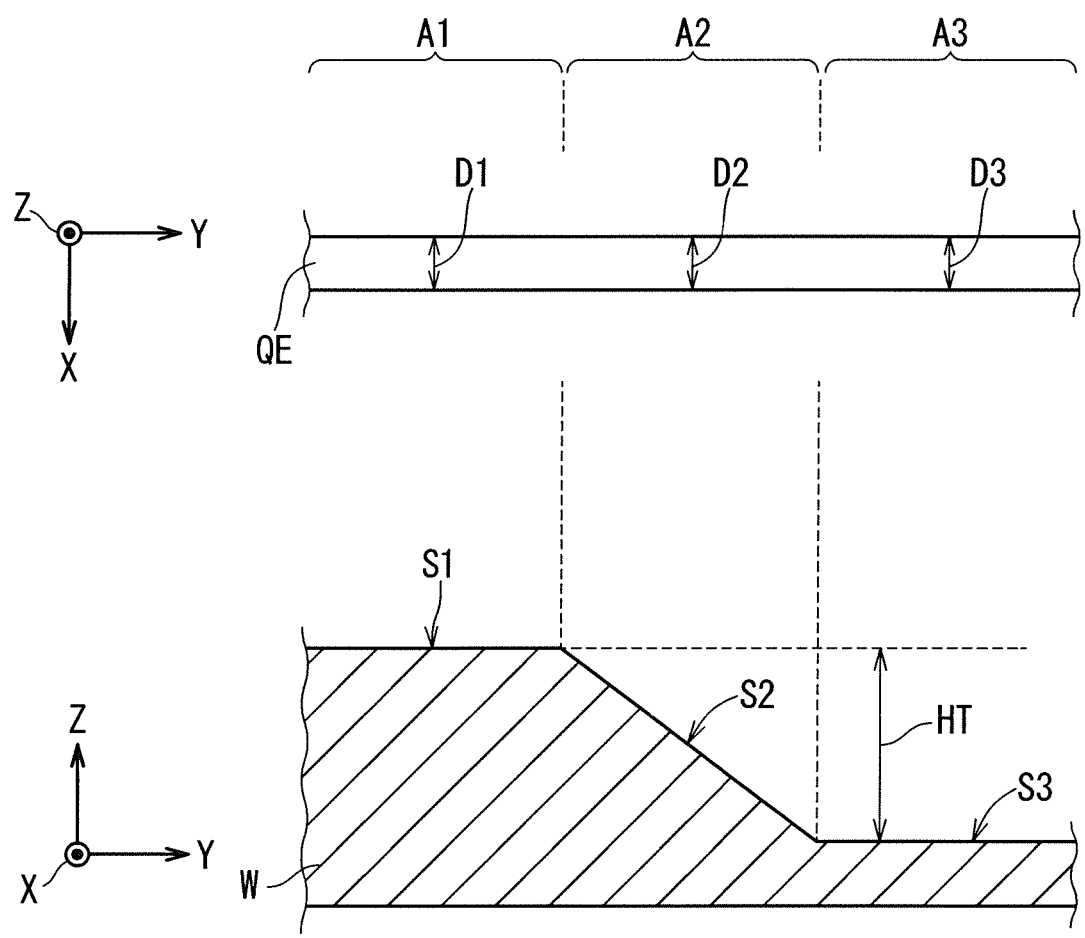
FIG. 13 is a view illustrating a plan view (in the upper part of the drawing) of a drawing pattern and a cross-sectional view of the substrate (in the lower part of the drawing) in the comparative example in the drawing method of FIG. 9.

The widths D2 and D3 of the drawing pattern QE (in the upper part of FIG. 13) obtained as a result of the above exposure scanning are corrected to be closer to the width D2 (and the width D3) of the design pattern PD (in the upper part of FIG. 6) as compared with the widths D2 and D3 of the drawing pattern QC (in the upper part of FIG. 7) of the comparative example. Note that FIG. 13 illustrates a case where the design pattern PD, which is the line pattern extending with the constant width, is drawn in a substantially faithful manner as the correction is performed with high accuracy. Although it is difficult to draw the design pattern PD in a substantially faithful manner in a case where the correction accuracy is lower, drawing closer to the design pattern PD can be performed as compared with the case of the comparative example.

Note that the partial region for determining the reference height in the surface profile is the highest surface S1 in the above example, but the partial region is not limited thereto. The partial region is preferably either the highest surface S1 or the lowest surface S3 of the surface profile, and is more preferably either the highest surface S1 or the lowest surface S3 that has a larger area.

Figure 14:
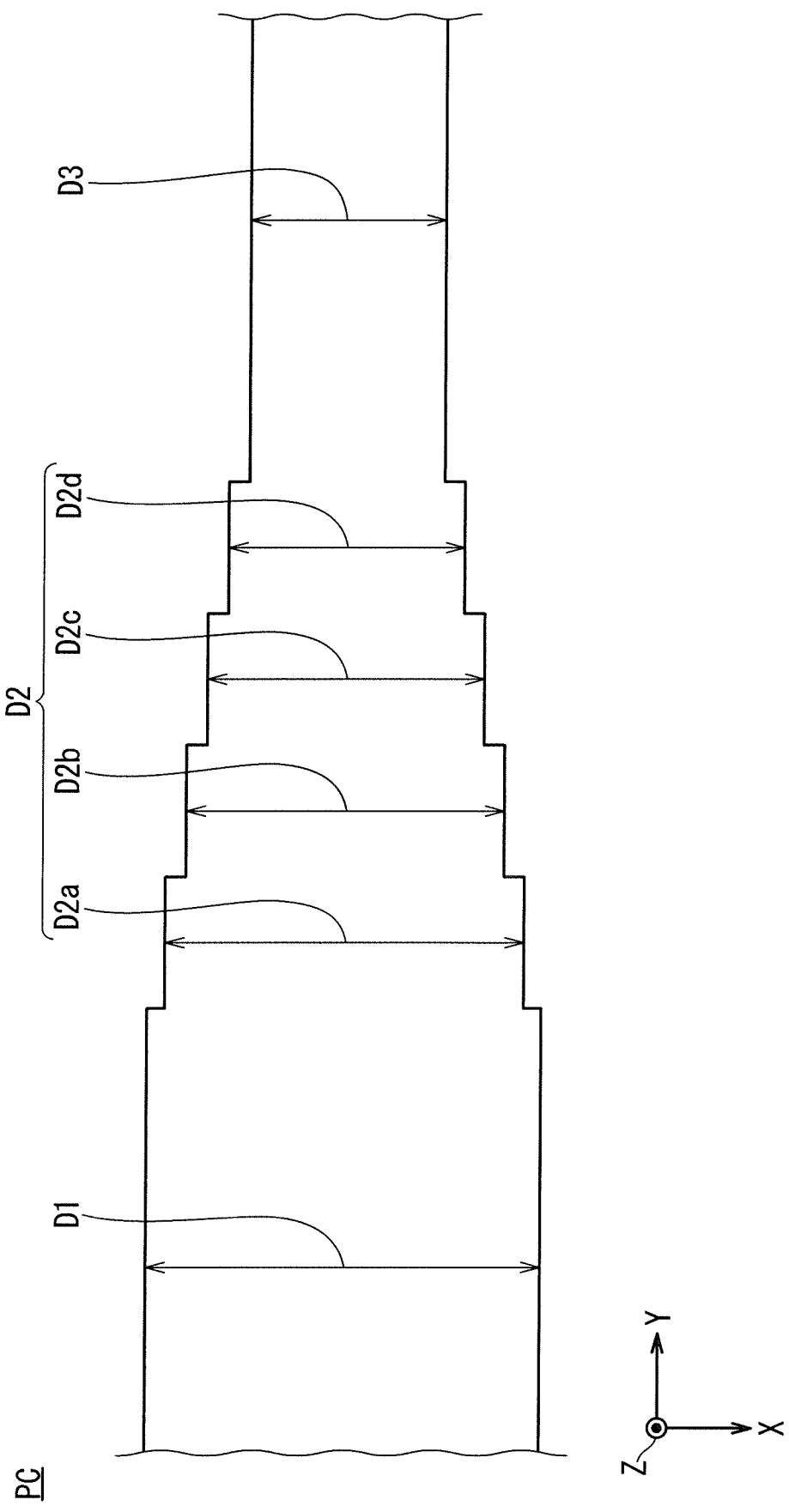
FIG. 14 is a plan view illustrating a correction pattern of FIG. 12 in consideration of resolution of the drawing apparatus.

FIG. 14 is a plan view illustrating the correction pattern PC of FIG. 12 in consideration of resolution of the drawing apparatus 100. In a case where a projection of the normal direction of the inclined surface S2 (FIG. 6) onto the horizontal plane is defined as an inclination direction, and the resolution of the drawing method is smaller than a dimension of the inclined surface S2 in the inclination direction, the correction pattern PC whose width changes in the middle of the inclination direction can be used as illustrated in FIG. 14. As the resolution increases, a width of the correction pattern PC can be changed in multiple stages, and the width D2 changes in four stages, such as widths D2a to D2d, in the example illustrated in FIG. 14.

According to the present embodiment, the correction pattern data is generated by correcting the design pattern data based on the surface profile data of the substrate W. The spatial light modulator 441 is controlled based on the correction pattern data. Accordingly, it is possible to perform the drawing with high accuracy on the surface having the shape whose height exceeds the focal depth without complicatedly adjusting the focus of the optical system.

The correction pattern data is generated by correcting the design pattern data based on the difference in the surface profile from the reference height that is the height of the partial region in the surface profile. Accordingly, the surface profile can be easily and effectively reflected on the correction pattern PC.

The partial region of the surface profile is either the highest surface S1 or the lowest surface S3 of the surface profile. Accordingly, the partial region can be easily determined.

The partial region of the surface profile either the highest surface S1 or the lowest surface S3 that has a larger area. Accordingly, the exposure with high accuracy can be performed without correction in a portion having a large area. Therefore, it is possible to simplify the correction processing while sufficiently maintaining an effect of the correction.

The controller 60 sets the focus position of the head part 402 to the reference height. Accordingly, the defocus occurs according to a deviation from the reference height. Therefore, the influence of defocus can be corrected with high accuracy.

The correction pattern data is generated by correcting the design pattern data such that the correction pattern PC is more reduced relative to the design pattern PD at the position where the difference in the surface profile from the reference height is larger on the substrate W. Accordingly, the surface profile can be easily and effectively reflected on the correction pattern PC.

In the exposure amount density distribution, the exposure amount density is higher at the position where the difference in surface profile from the reference height is larger on the substrate W. Accordingly, a decrease in the exposure amount density due to the defocus is corrected. Therefore, it is possible to suppress a resolution defect (for example, generation of an unintended resist residue after development or the like) caused by an insufficient exposure amount density.

Step ST60 (FIG. 9) is performed while maintaining the distance between the head part 402 and the stage 10 in the height direction. This simplifies the control of the distance between the head part 402 and the stage 10 in the height direction. Specifically, real-time autofocus becomes unnecessary.

When the substrate W has a surface profile having the level difference HT of 100 μm or more, the influence of defocus due to the level difference HT is likely to be remarkable. According to the present embodiment, this influence can be effectively suppressed.

The resolution of the drawing method is smaller than the dimension of the inclined surface S2 in the inclination direction described above. Accordingly, a plurality of portions of the inclined surface S2 in the inclination direction can be exposed under individual conditions. Therefore, the exposure correction on the inclined surface S2 can be performed more precisely.

The design pattern PD (in the upper part of FIG. 6) has the portion extending over the level difference HT. According to the present embodiment, disturbance of the drawing pattern at a site extending over the level difference HT, which is likely to occur in this case, is effectively suppressed.

A portion of the correction pattern PC (in the upper part of FIG. 12) corresponding to the line pattern extending with a constant width extends with a non-constant width due to the surface profile of the substrate W having the level difference HT. When the non-constant width in the correction pattern PC is adjusted, the drawing pattern QE (in the upper part of FIG. 13) can be adjusted to a width closer to the constant width.

Figure 15:
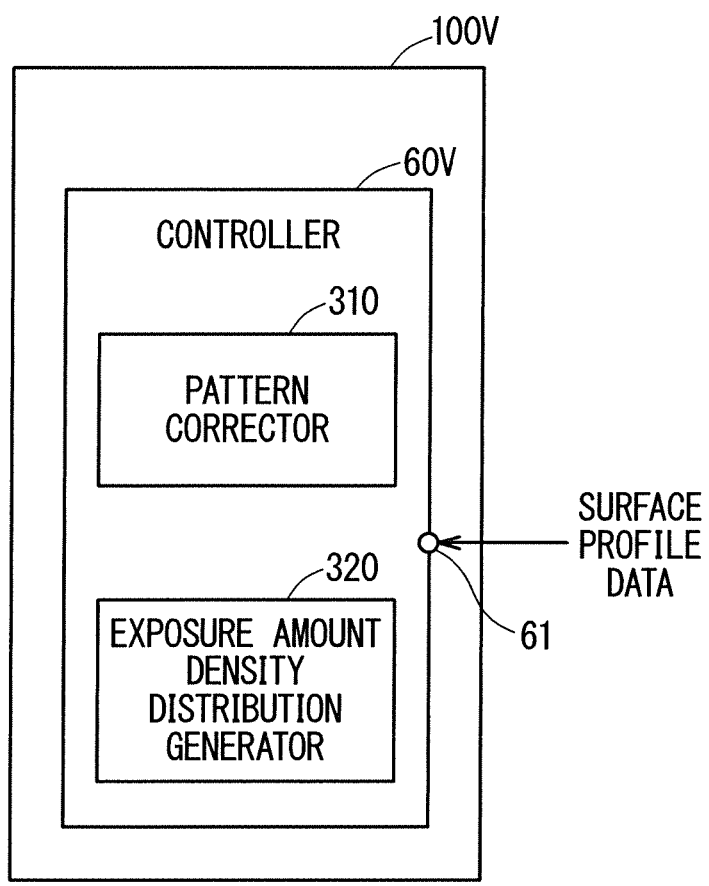
FIG. 15 is a block diagram schematically illustrating a configuration of a drawing apparatus according to another embodiment.

FIG. 15 is a block diagram schematically illustrating a configuration of a drawing apparatus 100V according to another embodiment. A controller 60V of the drawing apparatus 100V includes the pattern corrector 310 and the exposure amount density distribution generator 320 in addition to the configuration of the controller 60 described above. Note that the other configurations are substantially the same as those of the above-described embodiment (FIGS. 1 to 4), and thus, the description thereof will not be repeated.

Note that control according to the exposure amount density distribution is sometimes unnecessary depending on conditions of drawing processing. In such case, the exposure amount density may be uniform, and those related to the control among the above-described configurations and methods may be omitted.

The substrate W may be provided with a side wall surface perpendicular to a horizontal plane, instead of the inclined surface S2. In this case, in each of the design pattern PD (in the upper part of FIG. 6), the correction pattern PC (in the upper part of FIG. 12), and the drawing pattern QE (in the upper part of FIG. 13), the portion A2 is omitted, and the portion A1 and the portion A2 are adjacent to each other.

The design pattern PD (in the upper part of FIG. 6) is a line pattern extending along the scanning direction (Y direction), but the line pattern may extend along a direction intersecting the scanning direction. The design pattern is not limited to the line pattern, and may be another pattern (for example, a circular pattern).

The drawing pattern QE (FIG. 13) corresponds to a pattern of a portion where a resist is left by exposure processing and development processing in a case where the negative resist is used, and corresponds to a pattern of a portion where a resist is removed by exposure processing and development processing in a case where the positive resist is used.

Although the present invention has been described in detail, the above description is illustrative in all aspects, and the present invention is not limited thereto. It is understood that numerous modifications which are not illustrated can be assumed without departing from the scope of the present invention. The configurations described in the above embodiments and modifications can be appropriately combined as long as there is no contradiction therebetween or omitted.

EXPLANATION OF REFERENCE SIGNS

20: driving mechanism (mover)
40: optical unit
44: spatial light modulation unit
projection optical system
60V: controller
61: surface profile input part
62: drawing condition input part
100, 100V: drawing apparatus
300: design apparatus
310: pattern corrector
320: exposure amount density distribution generator
401: light source part
402: head part (drawing head)
441: spatial light modulator
500: drawing system
PD: design pattern
QC, QE: drawing pattern
W: substrate

The invention claimed is:

1. A drawing apparatus configured to perform drawing on an upper surface of a substrate based on a design pattern, the drawing apparatus comprising:
    a stage on which said substrate can be placed in a posture along a horizontal direction;
    a drawing head including a spatial light modulator that modulates light from a light source to generate modulated light, and a projection optical system that focuses said modulated light on a focus position in a height direction over said stage;
    a mover which relatively moves said stage and said drawing head in said horizontal direction; and
    a controller which controls said mover and said drawing head,
    wherein said controller controls said spatial light modulator based on correction pattern data representing a correction pattern, and said correction pattern data is generated by correcting design pattern data representing said design pattern based on surface profile data representing a surface profile of said substrate, said surface profile indicating height variations associated with said upper surface of said substrate,
    said correction pattern data is generated by correcting said design pattern data based on a difference in said surface profile from a reference height that is a height of a partial region in said surface profile, and
    said correction pattern data is generated by correcting said design pattern data such that said correction pattern is more reduced relative to said design pattern at a position where said difference in said surface profile from said reference height is larger on said substrate.

2. The drawing apparatus according to claim 1, wherein said controller sets a focus position of said drawing head to said reference height.

3. The drawing apparatus according to claim 1, wherein said controller controls said mover and said drawing head such that said substrate is exposed based on an exposure amount density distribution, and said exposure amount density distribution has a higher exposure amount density at a position where said difference in said surface profile from said reference height is larger on said substrate.

4. The drawing apparatus according to claim 1, wherein said partial region of said surface profile is either a portion having a maximum height or a portion having a minimum height in said surface profile.

5. The drawing apparatus according to claim 4, wherein said partial region of said surface profile has a larger area of said portion having said maximum height and said portion having said minimum height.

6. The drawing apparatus according to claim 1, wherein said controller includes a pattern corrector that generates said correction pattern data.

7. A drawing system comprising:
the drawing apparatus according to claim 1; and
a design apparatus including a pattern corrector that generates said correction pattern data.

8. A drawing method configured to perform drawing on an upper surface of a substrate based on a design pattern, the drawing method comprising:
(a) receiving surface profile data representing a surface profile of said substrate, said surface profile indicating height variations associated with said upper surface of said substrate;
(b) correcting design pattern data representing said design pattern based on said surface profile data to generate correction pattern data representing a correction pattern;
(c) placing said substrate on a stage in a posture along a horizontal direction;
(d) moving said stage on which said substrate has been placed and a drawing head relative to each other continuously or intermittently in said horizontal direction;
(e) generating modulated light by a spatial light modulator included in said drawing head; and
(f) irradiating said substrate with modulated light generated by said spatial light modulator controlled based on said correction pattern data while focusing said modulated light on a focus position in a height direction over said stage by a projection optical system included in said drawing head during execution of said (d) and said (e),
wherein said correction pattern data is generated by correcting said design pattern data based on a difference in said surface profile from a reference height that is a height of a partial region in said surface profile, and
said correction pattern data is generated by correcting said design pattern data such that said correction pattern is more reduced relative to said design pattern at a position where said difference in said surface profile from said reference height is larger on said substrate.

9. The drawing method according to claim 8, wherein said (f) is performed while maintaining a distance between said drawing head and said stage in said height direction.

10. The drawing method according to claim 8, wherein said substrate has said surface profile with a level difference of 100 µm or more.

11. The drawing method according to claim 10, wherein said level difference is formed by an inclined surface of said substrate, and
when a projection of a normal direction of said inclined surface on to a horizontal plane is defined as an inclination direction, resolution of said drawing method is smaller than a dimension of said inclined surface in said inclination direction.

12. The drawing method according to claim 10, wherein said design pattern includes a portion extending over said level difference.

13. The drawing method according to claim 12, wherein said portion extending over said level difference of said design pattern is a line pattern extending with a constant width, and
a portion, of said correction pattern, corresponding to said line pattern extends with a non-constant width due to said surface profile of said substrate having said level difference.

14. A drawing apparatus configured to perform drawing on an upper surface of a substrate based on a design pattern, the drawing apparatus comprising:
a stage on which said substrate can be placed in a posture along a horizontal direction;
a drawing head including a spatial light modulator that modulates light from a light source to generate modulated light, and a projection optical system that focuses said modulated light on a focus position in a height direction over said stage;
a mover which relatively moves said stage and said drawing head in said horizontal direction; and
a controller which controls said mover and said drawing head,
wherein said controller controls said spatial light modulator based on correction pattern data representing a correction pattern, and said correction pattern data is generated by correcting design pattern data representing said design pattern based on surface profile data representing a surface profile of said substrate, said surface profile indicating height variations associated with said upper surface of said substrate,
said correction pattern data is generated by correcting said design pattern data based on a difference in said surface profile from a reference height that is a height of a partial region in said surface profile, and
said controller controls said mover and said drawing head such that said substrate is exposed based on an exposure amount density distribution, and said exposure amount density distribution has a higher exposure amount density at a position where said difference in said surface profile from said reference height is larger on said substrate.

15. A drawing method configured to perform drawing on an upper surface of a substrate based on a design pattern, the drawing method comprising:
(a) receiving surface profile data representing a surface profile of said substrate, said surface profile indicating height variations associated with said upper surface of said substrate;
(b) correcting design pattern data representing said design pattern based on said surface profile data to generate correction pattern data representing a correction pattern;
(c) placing said substrate on a stage in a posture along a horizontal direction;

(d) moving said stage on which said substrate has been placed and a drawing head relative to each other continuously or intermittently in said horizontal direction by a mover;
(e) generating modulated light by a spatial light modulator included in said drawing head; and
(f) irradiating said substrate with modulated light generated by said spatial light modulator controlled based on said correction pattern data while focusing said modulated light on a focus position in a height direction over said stage by a projection optical system included in said drawing head during execution of said (d) and said (e),
wherein said correction pattern data is generated by correcting said design pattern data based on a difference in said surface profile from a reference height that is a height of a partial region in said surface profile, and
said mover and said drawing head are controlled such that said substrate is exposed based on an exposure amount density distribution, and said exposure amount density distribution has a higher exposure amount density at a position where said difference in said surface profile from said reference height is larger on said substrate.

\* \* \* \* \*